(12) United States Patent
Seo et al.

(10) Patent No.: US 9,829,510 B2
(45) Date of Patent: Nov. 28, 2017

(54) INTERPOSER FOR INSPECTING SEMICONDUCTOR CHIP

(71) Applicant: SK hynix Inc., Gyeonggi-do (KR)

(72) Inventors: Jae Hwan Seo, Gyeonggi-do (KR); Woo Yeol Shin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 15/090,907

(22) Filed: Apr. 5, 2016

(65) Prior Publication Data

US 2016/0305983 A1 Oct. 20, 2016

(30) Foreign Application Priority Data

Apr. 17, 2015 (KR) .......................... 10-2015-0054698

(51) Int. Cl.

| | |
|---|---|
| *G01R 31/00* | (2006.01) |
| *G01R 1/073* | (2006.01) |
| *H01L 21/66* | (2006.01) |
| *H01L 23/498* | (2006.01) |
| *G01R 1/04* | (2006.01) |

(52) U.S. Cl.
CPC .......... *G01R 1/07378* (2013.01); *H01L 22/00* (2013.01); *H01L 23/49827* (2013.01); *G01R 1/0483* (2013.01); *H01L 23/49811* (2013.01)

(58) Field of Classification Search
USPC ............. 324/762.01–762.05, 756.03–756.04, 324/755.01–755.11
See application file for complete search history.

(56) References Cited

U.S. PATENT DOCUMENTS

| | | | |
|---|---|---|---|
| 5,758,063 A * | 5/1998 | Lindsay ................. | G11C 29/56 714/29 |
| 7,746,656 B2 | 6/2010 | Shim et al. | |
| 8,035,210 B2 | 10/2011 | Yang et al. | |
| 2008/0309349 A1* | 12/2008 | Sutono .................... | H04L 43/50 324/537 |
| 2009/0166835 A1 | 7/2009 | Yang et al. | |
| 2009/0322364 A1* | 12/2009 | Mangrum .......... | G01R 31/2889 324/757.02 |

(Continued)

FOREIGN PATENT DOCUMENTS

KR 1020090072958 7/2009

*Primary Examiner* — Patrick Assouad
*Assistant Examiner* — Demetrius Pretlow
(74) *Attorney, Agent, or Firm* — IP & T Group LLP

(57) ABSTRACT

An interposer for inspecting reliability of a semiconductor chip is disclosed. The interposer for inspection includes: at least one active pad disposed in an active region of a first surface, and including: pads through which data and a control signal for testing an inspection target chip are received (input) and sent (output) during an active mode; and pads for receiving a power-supply voltage needed to operate the inspection target chip and the interposer during the active mode; at least one passive pad disposed in a passive region of the first surface, and including: pads receiving data for testing the inspection target chip during a passive mode, and a power-supply voltage needed to operate the inspection target chip and the interposer during the passive mode; and at least one bump pad disposed over a second surface facing the first surface, and to be coupled to the inspection target chip.

14 Claims, 4 Drawing Sheets

(56) References Cited

U.S. PATENT DOCUMENTS

| | | | |
|---|---|---|---|
| 2011/0084722 A1* | 4/2011 | Nishioka | G11C 5/02 324/762.01 |
| 2011/0234249 A1* | 9/2011 | Uematsu | G01R 31/2889 324/754.18 |
| 2011/0316572 A1* | 12/2011 | Rahman | G01R 31/2853 324/754.03 |
| 2013/0147032 A1* | 6/2013 | Jeng | H01L 23/49838 257/737 |
| 2016/0116530 A1* | 4/2016 | Whetsel | G01B 31/31853 324/750.3 |

* cited by examiner

INTERPOSER FOR INSPECTING SEMICONDUCTOR CHIP

CROSS-REFERENCE TO RELATED APPLICATION

The present application claims priority under 35 U.S.C §119(a) to Korean patent application No. 10-2015-0054698 filed on 17 Apr. 2015, in the Korean Intellectual Property Office, which is incorporated herein in its entirety by reference.

BACKGROUND OF THE INVENTION

Embodiments of the present disclosure relate generally to an interposer for inspecting the reliability of a semiconductor chip, and, more particularly, to an inspection interposer for testing a high-performance semiconductor chip according to an active and/or passive method.

With the rapid development of the semiconductor memory industry, semiconductor devices have been developed to implement low-priced products having lighter weights, smaller sizes, and higher degree of integration. In recent times, many developers and companies are conducting intensive research into three dimensional (3D) integrated circuits, such as stacked chip packages. Generally, a 3D integrated circuit includes an interposer for interconnect the stacked semiconductor chips. The interposer typically includes an insulation substrate and a plurality of conductive patterns embedded in the insulation substrate. The conductive patterns are coupled electrically to the stacked semiconductor chips.

In recent times, high-performance mobile DRAMs such as Wide IO2 (WIO2) have been developed. Since each high-performance mobile DRAM includes a large number of bumps, it is nearly impossible to manufacture a package for inspecting WIO2 reliability only using the WIO2. Furthermore, since the WIO2 includes a micro bump, it is difficult to inspect reliability of the micro bump when the package is manufactured using wire bonding or the like.

The present invention overcomes these issues associated with the prior art by employing a new interposer disposed between a substrate (PCB) and a high-performance semiconductor chip such as a WIO2 for inspecting the reliability of the high-performance semiconductor chip.

BRIEF SUMMARY OF THE INVENTION

Various embodiments of the present disclosure are directed to an interposer for inspecting a semiconductor chip that substantially obviates one or more problems due to limitations and disadvantages of the related art.

An embodiment of the present disclosure relates to an interposer having a new pad structure so as to inspect reliability of a high-performance semiconductor chip using both the active method and the passive method.

In accordance with an aspect of the present disclosure, an interposer for inspection includes: at least one active pad disposed in an active region of a first surface, and including: pads through which data and a control signal for testing an inspection target chip are input and output during an active mode; and pads for receiving a power-supply voltage needed to operate the inspection target chip and the interposer during the active mode; at least one passive pad disposed in a passive region of the first surface, and including: pads receiving data for testing the inspection target chip during a passive mode, and a power-supply voltage needed to operate the inspection target chip and the interposer during the passive mode; and at least one bump pad disposed over a second surface facing the first surface, and to be coupled to the inspection target chip.

It is to be understood that both the foregoing general description and the following detailed description of embodiments are exemplary and explanatory.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
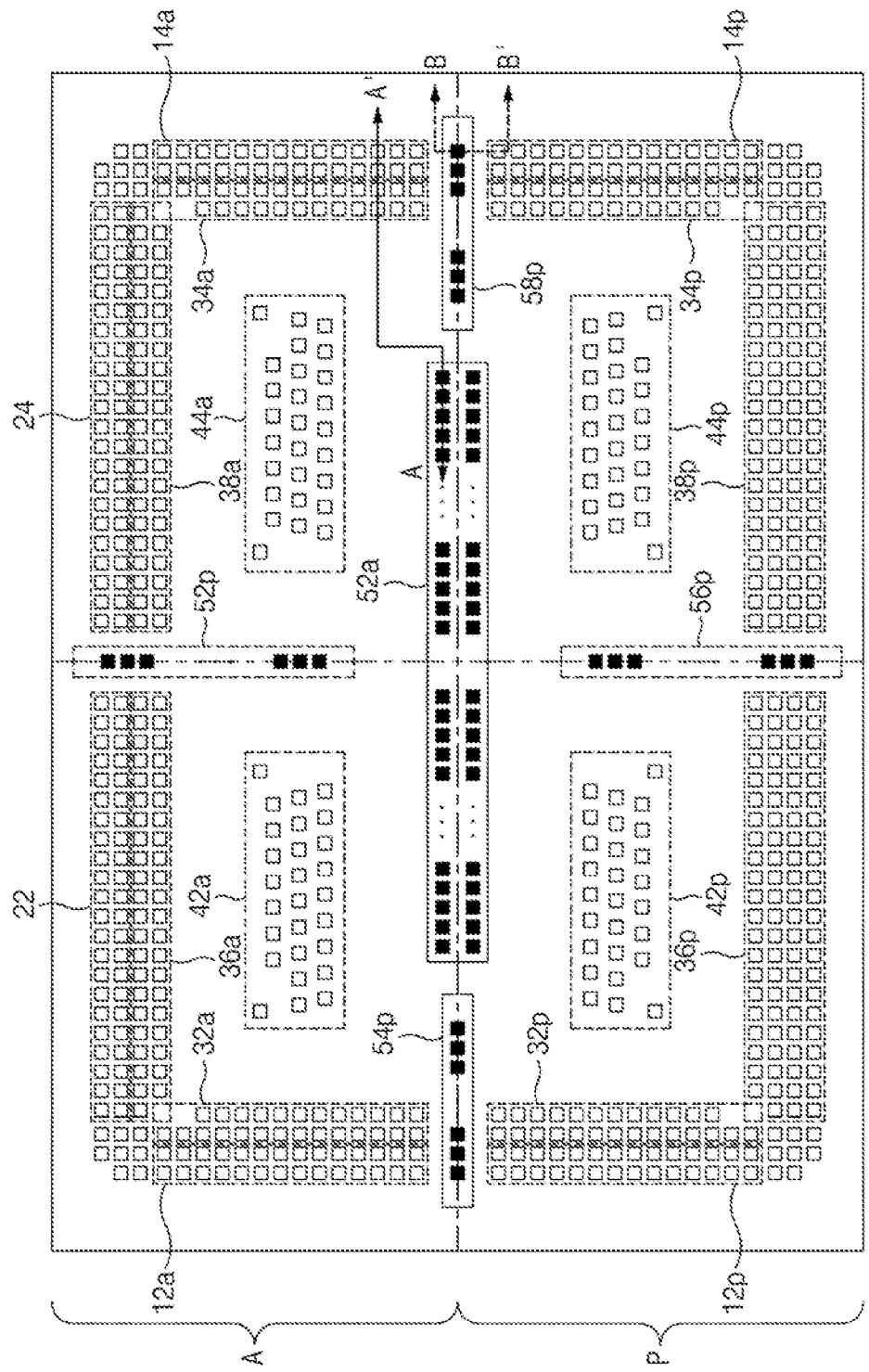
FIG. 1 is a plan view illustrating pads disposed over a surface of an inspection interposer facing a PCB substrate according to an embodiment of the present disclosure.
Figure 2:
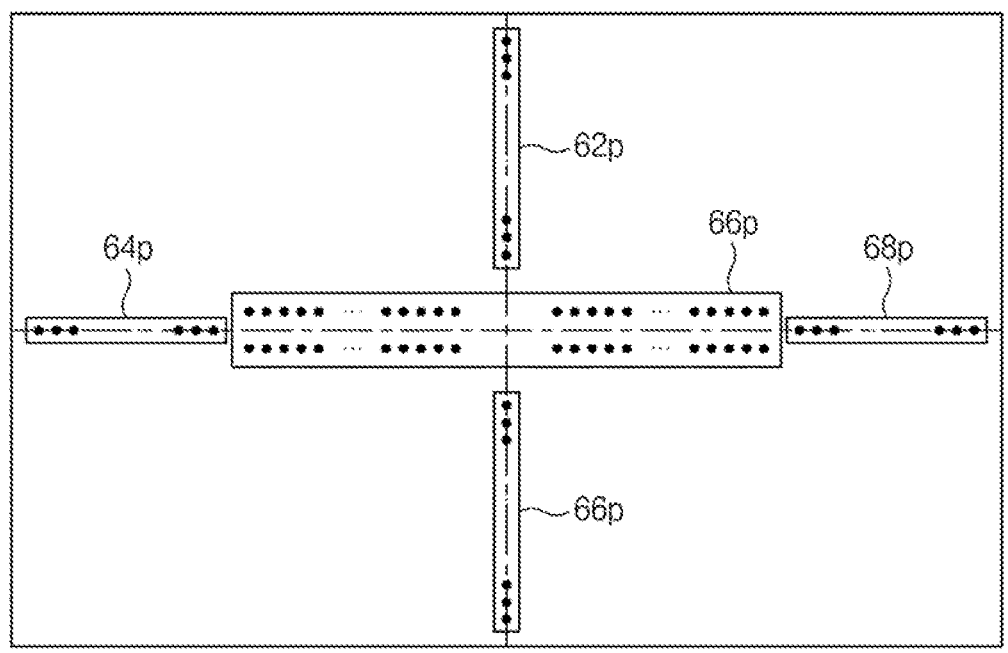
FIG. 2 is a plan view illustrating pads disposed over a surface of the inspection interposer facing an inspection target chip according to an embodiment of the present disclosure.

FIG. 1 is a plan view illustrating pads disposed over a surface (bottom surface) of an inspection interposer facing a PCB substrate according to an embodiment of the present disclosure. FIG. 2 is a plan view illustrating pads disposed over a surface (top surface) of the inspection interposer facing an inspection target chip.

Referring to FIG. 1, the bottom surface of the inspection interposer may be classified into a first region A (hereinafter referred to as an active region), in which pads for testing a chip (e.g., WIO2 chip) to be inspected (hereinafter referred to as an inspection target chip) in an active mode, are arranged and a second region P (hereinafter referred to as a passive region) in which pads for testing the inspection target chip in a passive mode, are arranged. The active and passive regions A and P may correspond to upper and lower parts, respectively, with reference to a horizontal center axis (horizontal axis) of FIG. 1.

Active pads arranged in the active region A may include active data input/output (I/O) pad units 12a and 14a; control signal I/O pad units 22 and 24; interposer power-supply pad units 32a, 34a, 36a and 38a; and power-supply pad units 42a and 44a for an inspection target chip. Passive pads arranged in the passive region P may include passive data I/O pad units 12p and 14p, interposer power-supply pad units 32p, 34p, 36p and 38p, and power-supply pad units 42p and 44p for an inspection target chip.

The active data I/O pad units 12a and 14a may include pads coupled to a PCB substrate so that active test data is received and sent through the pads during the active mode. The pads of the active data I/O pad units 12a and 14a may be arranged at the outermost part of the active region A in a manner that the pads are arranged parallel to the vertical center axis (vertical axis) in the active region A, and may be horizontally symmetrical to each other with reference to the vertical axis. In the illustrated embodiment illustrated in FIG. 1, pads of the active data I/O pad units 12a and 14a are arranged in two lines at the outermost part of the interposer, however, the invention is not limited in this way.

The control signal I/O units 22 and 24 may include pads coupled to a PCB substrate so that test control signals are input and output through the pads during the active mode. The pads of the control signal I/O pad units 22 and 24 are arranged at the outermost part of the active region A so that the pads are arranged perpendicular to the vertical axis and may be horizontally symmetrical to each other with reference to the vertical axis. In the illustrated embodiment, the pads of the control signal I/O pad units 22 and 24 may be arranged in two lines at the outermost part of the interposer. That is, pads of the active data I/O pad units 12a and 14a and pads of the control signal I/O pad units 22 and 24 may be formed in two lines, and may then enclose three surfaces of the outermost part of the active region A.

The interposer power-supply pad units 32a, 34a, 36a and 38a may include pads coupled to a PCB substrate so that power-supply voltages needed to operate the interposer can be received from the PCB substrate through the pads during the active mode. The pads of the interposer power-supply pad units 32a, 34a, 36a and 38a may be arranged in the active data I/O pad units 12a and 14a and the control signal I/O pad units 22 and 24. In this case, pads for a ground voltage and pads for drive power-supply voltages may be arranged to be distinguished from each other. For example, the pads for the ground voltage may be arranged in a line in the corresponding pads 12a, 14a, 22 and 24 in parallel to active data I/O pad units 12a and 14a and the control signal I/O pad units 22 and 24. The pads for drive voltages may be arranged in a line in the ground voltage pads in parallel to the ground voltage pads. The position of the ground voltage pads and the position of the drive voltage pads may be interchanged as necessary.

The power-supply pad units 42a and 44a for the inspection target chip may include pads coupled to a PCB substrate so that power-supply voltages needed to operate the inspection target chip can be received from the PCB substrate through the pads during the active mode. The pads of the power-supply pad units 42a and 44a for the inspection target chip may be arranged at the center part of each of the left region and the right region with reference to the horizontal axis in the active region A. That is the pads of the power supply pad unit 42a for the inspection target chip may be arranged in a left region of the active region A defined by the horizontal and vertical axes of the active region A and by the interposer power-supply pad units 32a, and 36a. Also, the pads of the power-supply pad unit 44a for the inspection target chip may be arranged in a right region of the active region A defined by the horizontal and vertical axes of the active region A and by the interposer power-supply pad units 34a and 38a. For example, among a plurality of pads of the power-supply pad units 42a and 44a for the inspection target chip, 9 pads located closest to the via pads 52a and arranged in a line may be used for a first power supply voltage, subsequent 9 pads arranged in a line may be used for a second power supply voltage, subsequent 7 pads arranged in a line may be used for a third power supply voltage, and the subsequent two pads arranged at both sides of the pads for the third power supply voltage may be used for the first power supply voltage.

The passive data I/O pad units 12p and 14p may include pads coupled to the PCB substrate so that passive test data is received and sent during the passive mode. Pads of the passive data I/O pad units 12p and 14p may be arranged at the outermost part of the interposer so that the pads are arranged parallel to the vertical axis in the passive region P, and may be horizontally symmetrical to each other with reference to the vertical axis. In the illustrated embodiment, pads of the passive data I/O pad units 12p and 14p may be arranged in two lines at the outermost part of the interposer. The pads of the passive data I/O pad units 12p and 14p may be arranged symmetrical to the pads of the active data I/O pad units 12a and 14a with reference to the horizontal axis.

The interposer power-supply pad units 32p, 34p, 36p and 38p may include pads coupled to the PCB substrate so that power-supply voltages needed to operate the interposer are received from the PCB substrate through the pads during the passive mode. The pads of the interposer power-supply pad units 32p and 34p may be arranged in the passive data I/O pad units 12p and 14p of the passive region P. The pads of the interposer power-supply pad units 36p and 38p may be arranged at the outermost part of the passive region P so that the pads are arranged perpendicular to the vertical axis, and may be horizontally symmetrical to each other with reference to the vertical axis. The pads of the interposer power-supply pad units 32p, 34p, 36p and 38p, the pads of the ground voltage pads, and the pads of the drive voltages may be distinguished from one another. For example, the ground voltage pads among the interposer power-supply pad units 32p and 34p may be arranged in a line in the passive data I/O pad units 12p and 14p, and the pads of drive voltages may be arranged in a line in the ground voltage pads. In addition, the ground voltage pads among the interposer power-supply pad units 36p and 38p may be arranged in three lines at the outermost part, and the pads of the drive voltages may be arranged in a line in the pads of the ground voltage. That is, the pads of the interposer power-supply pad units 32p and 34p may be arranged symmetrical to the interposer power-supply pad units 32a and 34a with reference to the horizontal axis, and the pads of the interposer power-supply pad units 36p and 38p may be located symmetrical not only to the control signal I/O pad units 22 and 24 but also to the interposer power-supply pad units 36a and 38a with reference to the horizontal axis.

The power-supply pad units 42p and 44p for the inspection target chip may include pads coupled to the PCB substrate so that power-supply voltages needed to operate the inspection target chip can be received from the PCB substrate through the pads during the passive mode. The pads of the power-supply pad units 42p and 44p for the inspection target chip may be arranged at the center part of each of the left region and the right region with reference to the horizontal axis in the passive region P. That is, the pads of the power-supply pad unit 42p for the inspection target chip may be arranged in the left region defined by horizontal and vertical axes of the passive region P and by the interposer power-supply pad units 32a and 36a. The pads of the power-supply pad unit 44p for the inspection target chip may be arranged in the region enclosed not only by horizontal and vertical axes of the passive region P but also by the interposer power-supply pad units 32a, 34a, 36a and 38a. For example, among a plurality of pads of the power-supply pad units 42p and 44p for the inspection target chip, 9 pads located closest to the via pads 52a and arranged in a line may be used for the first power supply voltage, subsequent 9 pads arranged in a line may be used for the second power supply voltage, subsequent 7 pads arranged in a line may be used for the third power supply voltage, and the subsequent two pads arranged at a lower part of both sides of the pads for the third power supply voltage may be used for the first power supply voltage.

Figure 3:
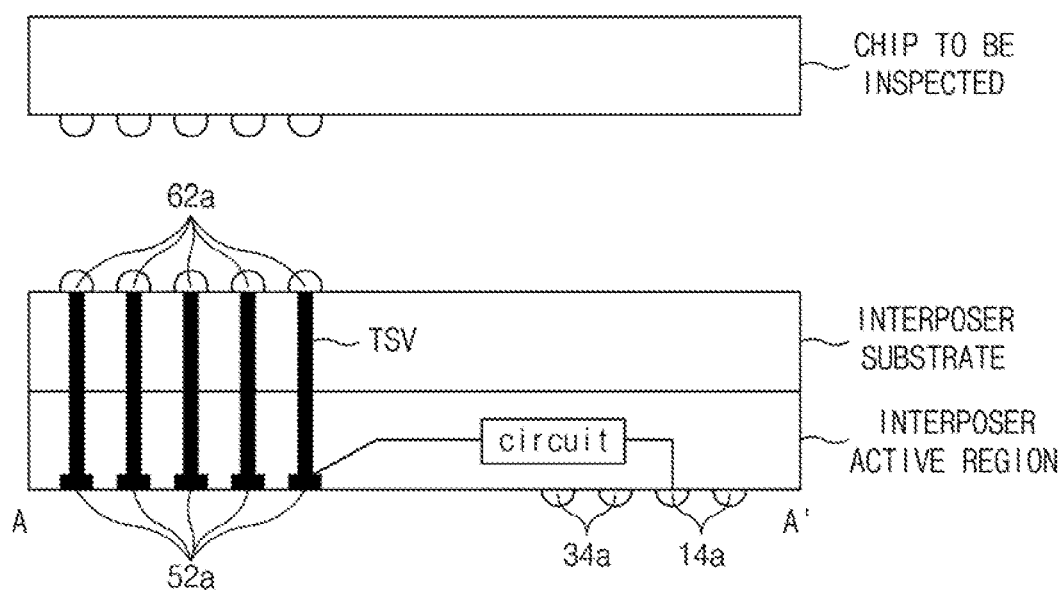
FIG. 3 is a cross-sectional view illustrating the structure taken along the line A-A' of FIG. 1.

In addition, the via pads 52a coupled to micro-bump pads 62a (FIG. 3) of the top surface may be arranged at the center part of the bottom surface of the interposer through a Through Silicon Via (TSV is shown in FIG. 3). In addition, via pads 52p, 54p, 56p and 58p coupled to micro-bump pads 62p, 64p, 66p and 68p (shown in FIG. 2) of the top surface may be arranged to be symmetrical in up, down, left and right directions of the via pads 52a in the horizontal-axis region and the vertical-axis region via a TSV.

The active bump pads 62a and the passive bump pads 62p, 64p, 66p and 68p coupled to the inspection target chip may be arranged over the interposer as shown in FIG. 2. The active bump pads 62a may be arranged at the center part of the top surface, so that the interposer can transmit and receive test data to and from the inspection target chip during the active mode and may provide the power-supply voltage to the inspection target chip during the active mode. The passive bump pads 62p, 64p, 66p and 68p may be arranged to be symmetrical in up, down, left, and right directions of the bump pad 62a with reference to the horizontal and vertical axes, so that the interposer can transmit and receive test data to and from the inspection target chip during the passive mode and can provide the operation power-supply voltage to the inspection target chip during the passive mode.

Figure 4:
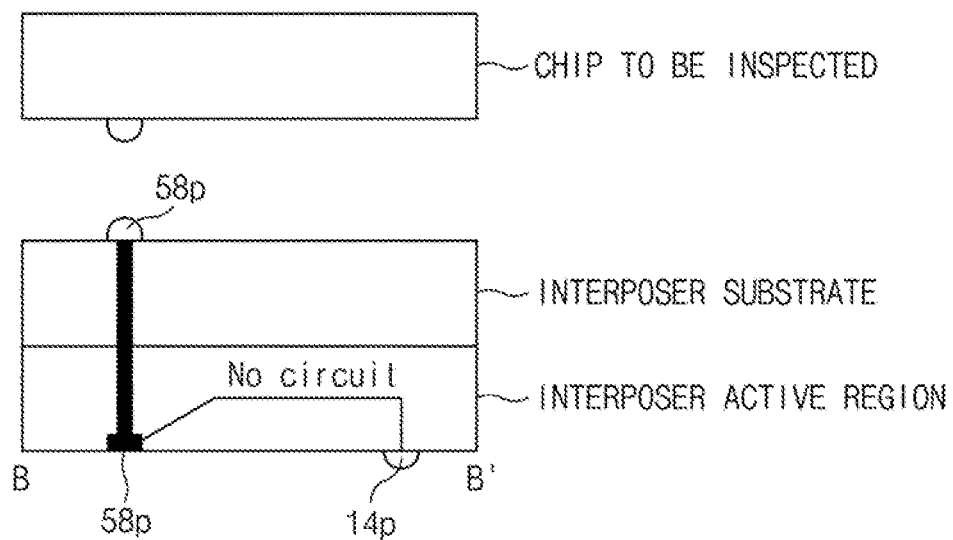
FIG. 4 is a cross-sectional view illustrating the structure taken along the line B-B' of FIG. 1.

FIG. 3 is a cross-sectional view illustrating the structure taken along the line A-A' of FIG. 1. FIG. 4 is a cross-sectional view illustrating the structure taken along the line B-B' of FIG. 1.

Referring to FIG. 3, the active bump pads 62a arranged at the center part of the top surface of the interposer may be used as pads coupled to the inspection target chip, and may be coupled to the via pads 52a of the bottom surface through a TSV. The via pads 52a may be coupled to circuits (e.g., repeaters: not shown) for testing the inspection target chip. The circuits may process the data and control signal received from the PCB substrate through the active data I/O pad units 12a and 14a and the control signal I/O pad units 22 and 24 during the active mode, and may output the processed data and control signal to the via pads 52a. Pads of the interposer power-supply pad units 32a, 34a, 36a and 38a and pads of the power-supply pad units 42a and 44a for the inspection target chip may be directly coupled to the active bump pads 62a through an internal line of the interposer, or may be coupled to the active bump pads 62a through a circuit.

The above-mentioned circuits may be arranged in the region enclosed by horizontal and vertical axes and the interposer power-supply pad units 32a, 34a, 36a and 38a which is similar to the power-supply pad units 42a and 44a for the inspection target chip. That is, the circuits may be properly arranged between the pads of the power-supply pad units 42a and 44a for the inspection target chip.

The via pads 52p, 54p, 56p and 58p arranged to be symmetrical in up, down, left, and right regions of the via pads 52a with reference to the horizontal axis and the vertical axis may be coupled to the passive bump pads 62p, 64p, 66p and 68p located at the top surface of the interposer through a TSV. The via pads 52p, 54p, 56p and 58p may be directly coupled to pads of the passive data I/O pad units 12p and 14p of the passive region, pads of the interposer power-supply pad units 32p, 34p, 36p and 38p, and pads of the power-supply pad units 42p and 44p for the inspection target chip through a line.

As is apparent from the above description, the interposer for the semiconductor device according to an embodiment of the present disclosure may inspect the reliability of a high-performance semiconductor chip using both the active method and the passive method.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

Various alternatives and equivalents are possible. For example, the invention is not limited by the type of deposition, etching polishing, and patterning steps described herein. Nor is the invention limited to any specific type of semiconductor device. For example, the present disclosure may be implemented in a dynamic random access memory (DRAM) device or nonvolatile memory device. Other additions, subtractions, or modifications may be envisaged by those skilled in the relevant art in view of the present disclosure without departing from the spirit and/or scope of the invention as defined by the appended claims.

What is claimed is:

1. An interposer for inspection of a semiconductor device, the interposer comprising:
   active pads disposed in an active region of a first surface, and including: pads through which data and a control signal for testing an inspection target chip are input and output during an active mode; and pads for receiving a power-supply voltage needed to operate the inspection target chip and the interposer during the active mode;
   passive pads disposed in a passive region of the first surface, and including: pads receiving data for testing the inspection target chip during a passive mode, and a power-supply voltage needed to operate the inspection target chip and the interposer during the passive mode; and
   bump pads disposed over a second surface facing the first surface, and to be coupled to the inspection target chip,
   wherein the first surface is divided into the active region and the passive region with reference to a first center axis, and
   wherein the active pads and the passive pads are arranged symmetrical with reference to the first center axis.

2. The interposer for inspection according to claim 1, wherein the at least one active pads includes:
   an active data input/output (I/O) pad unit including pads through which active test data is received and sent;
   a control signal I/O pad unit including pads through which test control signals are received and sent;
   a first power-supply pad unit for the interposer for receiving a power-supply signal needed to operate the interposer; and
   a first power-supply pad unit for the inspection target chip for receiving a power-supply signal needed to operate the inspection target chip.

3. The interposer for inspection according to claim 2, wherein the active data I/O pad unit includes pads arranged parallel to a second center axis perpendicular to the first center axis, and arranged at the outermost part of the active region while being arranged symmetrical to each other with reference to the second center axis.

4. The interposer for inspection according to claim 3, wherein the control signal I/O pad unit includes pads arranged perpendicular to the second center axis, and arranged at the outermost part of the active region while being symmetrical to each other with reference to the second center axis.

5. The interposer for inspection according to claim 4, wherein the first power-supply pad unit for the interposer includes pads arranged at one side of the active data I/O pad unit and the control signal I/O pad unit, and arranged parallel to pads of the active data I/O pad unit and pads of the control signal I/O pad unit.

6. The interposer for inspection according to claim 5, wherein the first power-supply pad unit for the inspection target chip is arranged in a region enclosed by the first center axis, the second center axis and the first power-supply pad unit for the interposer.

7. The interposer for inspection according to claim 1, wherein the at least one passive pads includes:
- a passive data input/output (I/O) pad unit including pads through which passive test data is received and sent;
- a second power-supply pad unit for the interposer for receiving a power-supply signal needed to operate the interposer; and
- a second power-supply pad unit for the inspection target chip for receiving a power-supply signal needed to operate the inspection target chip.

8. The interposer for inspection according to claim 7, wherein the passive data I/O pad unit includes pads arranged parallel to a second center axis perpendicular to the first center axis, and arranged at the outermost part of the passive region while being arranged symmetrical to each other with reference to the second center axis.

9. The interposer for inspection according to claim 8, wherein the second power-supply pad unit for the interposer includes:
- pads arranged parallel to the passive data I/O pad unit, and arranged at one side of the passive data I/O pad unit; and
- pads arranged perpendicular to the second center axis, and arranged at the outermost part of the passive region while being arranged symmetrical to each other with reference to the second center axis.

10. The interposer for inspection according to claim 9, wherein the second power-supply pad unit for the inspection target chip is arranged in a region enclosed by the first center axis, the second center axis and the second power-supply pad unit for the interposer.

11. The interposer for inspection according to claim 1, wherein the at least one bump pads includes:
- active bump pads arranged in a center part of the second surface, and for transmitting and receiving test data to and from the inspection target chip during the active mode, and then providing a power-supply signal to the inspection target chip during the active mode; and
- passive bump pads arranged in up, down, left, and right regions of the active bump pads while being arranged symmetrical to each other with reference to the first center axis and a second center axis orthogonal to the first center axis, and for transmitting and receiving test data to and from the inspection target chip during the passive mode, and then providing a power-supply signal to the inspection target chip during the passive mode.

12. The interposer for inspection according to claim 11, wherein the passive bump pads are coupled to the passive pads through a Through Silicon Via (TSV).

13. The interposer for inspection according to claim 11, further comprising a circuit for processing data received through the active pads and providing the processed data to the bump pads during the active mode.

14. The interposer for inspection according to claim 13, wherein the active bump pads are coupled to the circuit through a Through Silicon Via (TSV).

* * * * *